United States Patent
Riedel et al.

(10) Patent No.: US 7,427,548 B2
(45) Date of Patent: Sep. 23, 2008

(54) METHOD FOR PRODUCING CHARGE-TRAPPING MEMORY CELL ARRAYS

(75) Inventors: Stephan Riedel, Dresden (DE); Stefano Parascandola, Dresden (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 178 days.

(21) Appl. No.: 11/170,187

(22) Filed: Jun. 29, 2005

(65) Prior Publication Data

US 2007/0004153 A1 Jan. 4, 2007

(51) Int. Cl.
*H01L 21/336* (2006.01)
(52) U.S. Cl. .................................... 438/287
(58) Field of Classification Search ............... 438/287
See application file for complete search history.

(56) References Cited

U.S. PATENT DOCUMENTS

| | | | |
|---|---|---|---|
| 6,963,108 B1 * | 11/2005 | Kang et al. | 257/330 |
| 6,972,226 B2 * | 12/2005 | Deppe et al. | 438/201 |
| 2003/0001213 A1 * | 1/2003 | Lai | 257/390 |
| 2005/0093047 A1 | 5/2005 | Goda et al. | |
| 2005/0253189 A1 * | 11/2005 | Cho et al. | 257/330 |

FOREIGN PATENT DOCUMENTS

WO   WO 2005/096382 A1   10/2005

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—David E Graybill
(74) *Attorney, Agent, or Firm*—Slater & Matsil, L.L.P.

(57) ABSTRACT

A memory layer sequence comprising a lower confinement layer (2), a charge-trapping layer (3), and an upper confinement layer (4) is applied on the main surface of a silicon substrate (1). By a photolithography step, trenches running parallel at a distance from one another are etched to delimitate the active area. A trench filling (7) is applied by growth or deposition of dielectric material or by a selective oxidation of the substrate material. After the removal of the charge-trapping layer sequence in a peripheral area and the deposition of a gate dielectric material provided for the transistors of an addressing circuitry, wordline stacks (8) are formed.

20 Claims, 2 Drawing Sheets

METHOD FOR PRODUCING CHARGE-TRAPPING MEMORY CELL ARRAYS

TECHNICAL FIELD

This method concerns the production of semiconductor memory devices that comprise charge-trapping memory cells, which are arranged in arrays of rows and columns and which are separated by shallow trench isolations.

BACKGROUND

Non-volatile memory cells that are electrically programmable and erasable can be realized as charge-trapping memory cells, which comprise a memory layer sequence of dielectric materials, which is provided for charge-trapping in a memory layer that is arranged between confinement layers. The confinement layers have a larger energy band gap than the memory layer. The memory layer can be silicon nitride, while the confinement layers are usually silicon oxide. The memory layer sequence is arranged between a channel region that is located within a semiconductor body and a gate electrode that is arranged above the channel region and is provided to control the channel by means of an applied electric voltage. Charge carriers moving from source to drain through the channel region are accelerated and gain enough energy to be able to pass the lower confinement layer and to be trapped in the memory layer. The trapped charge carriers change the threshold voltage of the cell transistor structure.

A publication by B. Eitan et al., "NROM: a Novel Localized Trapping, 2-Bit Nonvolatile Memory Cell" in IEEE Electron Device Letters, volume 21, pages 543 to 545 (2000), describes a charge-trapping memory cell with a memory layer sequence of oxide, nitride and oxide, which is especially adapted to be operated with a reading voltage that is reverse to the programming voltage (reverse read). This publication is incorporated herein by reference. The oxide-nitride-oxide layer sequence is especially designed to avoid the direct tunneling regime and to guarantee the vertical retention of the trapped charge carriers. The oxide layers are specified to have a thickness of more than 5 nm. Two bits of information can be stored in every memory cell.

The ONO (oxide-nitride-oxide) sequence is grown or deposited onto a main surface of a semiconductor substrate in such a fashion that it extends over the complete area provided for the memory cell array before other method steps are performed. These further method steps include a deposition and structuring of wordline stacks comprising the gate electrodes and an implantation of the source and drain regions. The effective channel width of the charge-trapping memory cells is crucially affected by the final top width of the shallow trench isolations, which are provided to electrically insulate columns of memory cells within the array. Other important factors are the step height of the trench fillings and the thickness of the ONO layer. There is a plurality of other process steps that also affect the performance of the memory cells. These concern the exact dimensions of the insulating trenches and the thickness of the trench filling as well as several method steps by which auxiliary or sacrificial layers are removed or structured. Inevitable variations of the process parameters result in problems of a threshold voltage distribution that is too large and in degraded retention-after-cycling values (RAC). A further miniaturization of the memory devices will probably aggravate these problems.

SUMMARY OF THE INVENTION

In one aspect, the present invention provides a method for producing charge-trapping memory cell arrays that allows a better control of the effective channel width.

In a further aspect, this method improves the reliability and yield of charge-trapping memory devices and to enable further shrinking of the array dimensions.

The method for producing charge-trapping memory cell arrays according to embodiments of this invention comprises the steps of providing a silicon substrate having a main surface; applying a lower confinement layer of dielectric material onto that surface; applying a charge-trapping layer of dielectric material onto the lower confinement layer; applying an upper confinement layer of dielectric material onto the charge-trapping layer; performing a lithography step and a subsequent etching step to form trenches running parallel at a distance from one another at the surface; and filling the trenches by a selective oxidation of the surface of the silicon substrate. The upper confinement layer can also be produced by a deposition or growth step after or in conjunction with the trench fillings. Instead of a selective oxidation, the trench fillings can be produced by a deposition or growth of the dielectric material, preferably oxide.

DESCRIPTION OF THE DRAWINGS

For a more complete understanding of the present invention, and the advantages thereof, reference is now made to the following descriptions taken in conjunction with the accompanying drawing, in which.

Figure 1:
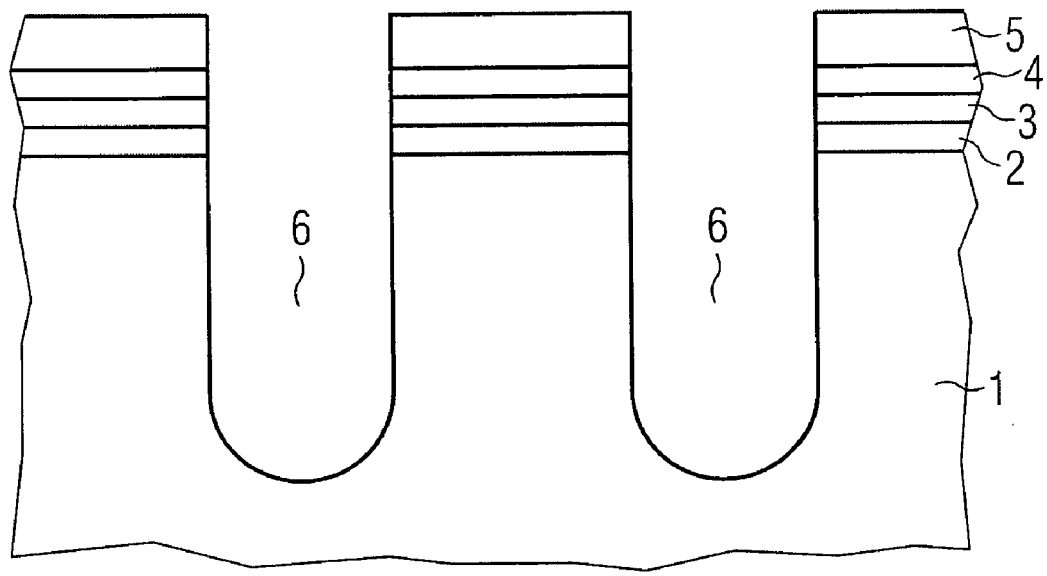
FIG. 1 shows a cross-section of an intermediate product after the formation of the memory layer sequence and the etching of the trenches.

The following list of reference symbols can be used in conjunction with the figures:

1 substrate
2 lower confinement layer
3 charge-trapping layer
4 upper confinement layer
5 resist layer
6 trench
7 trench filling
8 wordline stack
9 upper confinement layer

DETAILED DESCRIPTION OF ILLUSTRATIVE EMBODIMENTS

In preferred embodiments the present invention, proposes a method to provide the memory cell array with a shallow trench isolation, in which the effective channel width is determined only by the extension of the charge-trapping layer after the insulating trenches have been etched. The method is characterized by the fact that the charge-trapping layer is deposited or grown before the active areas between the trenches are structured. FIG. 1 shows a cross-section of an intermediate product of a first variant of this method. A silicon substrate 1 is provided with a charge-trapping layer sequence by the application of a lower confinement layer 2, preferably silicon oxide, a charge-trapping layer 3, preferably silicon nitride, and an upper confinement layer 4, preferably silicon oxide. A resist layer 5 is applied and structured by photolithography to form a mask to be used in a subsequent etching step. By this etching, which can preferably be a dry etching, the trenches 6 that run parallel at a distance from one another are etched into the surface of the substrate 1. Thus, active areas between the trenches are formed according to the desired dimensions of the memory cells.

Figure 2:
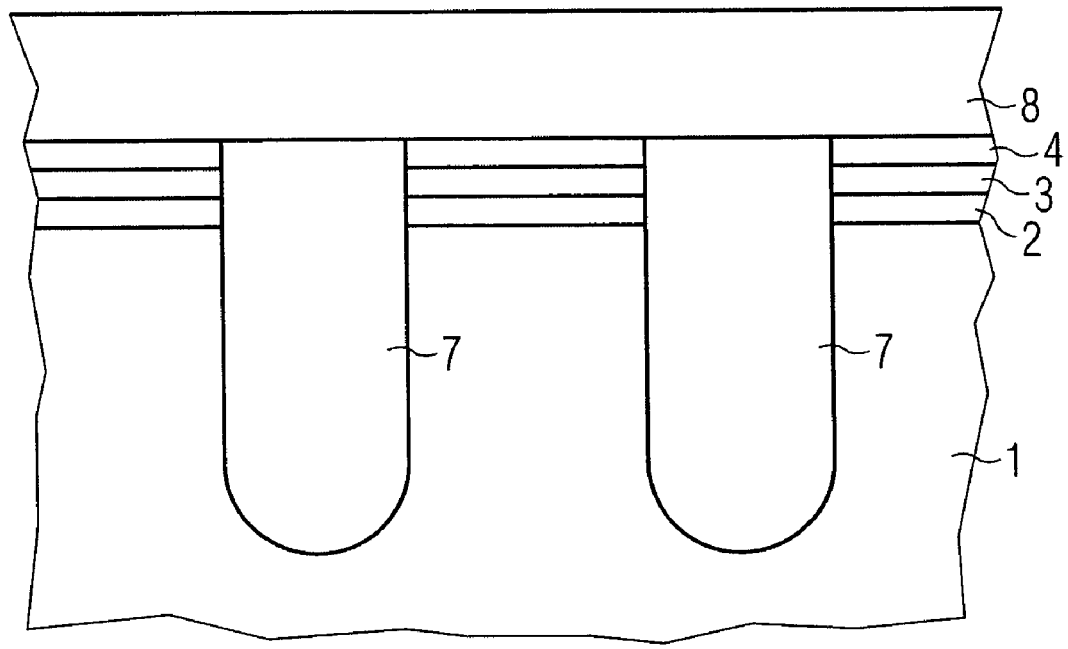
FIG. 2 shows a cross-section according to FIG. 1 after the filling of the trenches and the application of the wordline stacks.

In a subsequent method step, the trenches 6 are filled by a selective oxidation of the surface of the silicon substrate 1. This can be seen from FIG. 2, which shows a cross-section according to FIG. 1 with the trench fillings 7. Then, the area that is provided for the memory cell array is covered with a further mask, and the charge-trapping layer sequence is removed in an area that is provided for an addressing circuitry, especially a CMOS circuitry. In the area of the addressing circuitry, an appropriate gate dielectric is applied for the CMOS transistors; then the further mask is removed. The wordline stacks 8 are applied and structured to run across the trench fillings.

Figure 3:
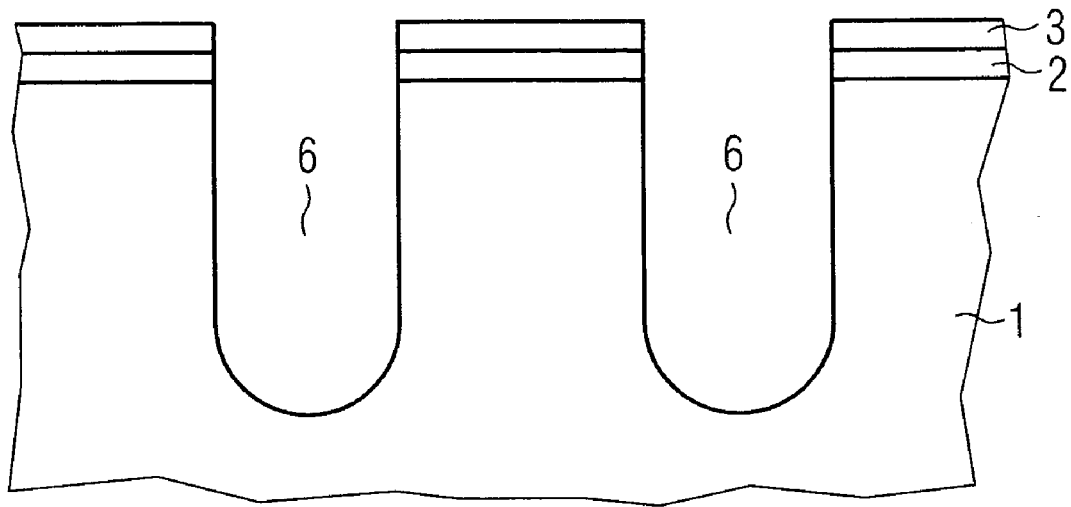
FIG. 3 shows a cross-section according to FIG. 1 of an intermediate product of an alternative method.
Figure 4:
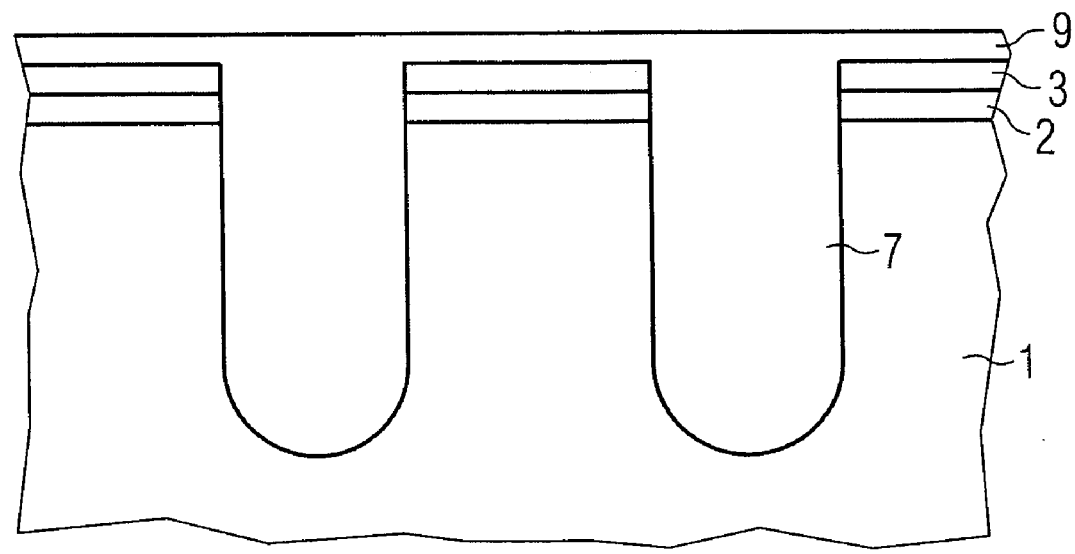
FIG. 4 shows a cross-section according to FIG. 3 after the filling of the trenches and the application of the upper confinement layer.

Another variant of the method will be described in connection with FIGS. 3 and 4. In this variant, the main surface of the silicon substrate 1 is only provided with the lower confinement layer 2 and the charge-trapping layer 3. Then, the resist mask is applied and structured, and the trenches 6 are etched. After the removal of the resist mask, the structure of the intermediate product shown in cross-section in FIG. 3 is achieved. Then, a trench filling is introduced into the trenches either by the application of a dielectric material that is grown or deposited and also serves as the upper confinement layer 9 (FIG. 4), or the trenches are filled by a selective oxidation of the substrate silicon material, followed by a further growth or deposition step, by which the upper confinement layer 9 is formed. In both cases, the upper confinement layer 9 can be oxide.

After the trenches have been filled and the upper confinement layer has been formed, the area that is provided for the memory cell array can be covered with a further mask according to the previously described method variant, and the charge-trapping layer sequence can be removed from the area that is provided for the addressing circuitry. The gate dielectric provided for the addressing logic circuitry is applied, the further mask is removed, and the wordline stacks are applied and structured according to the previously described embodiment.

What is claimed is:

1. A method for producing a charge-trapping memory cell array, the method comprising:
    providing a semiconductor body having a main surface;
    applying a lower confinement layer of a first dielectric material over said semiconductor body;
    applying a charge-trapping layer over said lower confinement layer;
    applying an upper confinement layer of a second dielectric material over said charge-trapping layer;
    after applying the upper confinement layer, performing a lithography step and a subsequent etching step to form trenches running parallel at a distance from one another at said main surface;
    filling said trenches with a third dielectric material; and
    after the filling the trenches, forming a wordline stack over the upper confinement layer.

2. The method according to claim 1, wherein the semiconductor body comprises a silicon substrate.

3. The method according to claim 2, wherein filling said trenches comprises filling said trenches with an oxide material by a selective oxidation of a surface of the silicon substrate.

4. The method according to claim 1, wherein applying a charge-trapping layer comprises applying a silicon nitride layer.

5. The method according to claim 4, wherein applying the lower confinement layer comprises applying a first oxide layer and wherein applying the upper confinement layer comprises applying a second oxide layer.

6. The method according to claim 1, further comprising:
    covering an area of said main surface that is provided for the memory cell array by a mask, after filling the trenches;
    removing said upper confinement layer, said charge-trapping layer and said lower confinement layer in an area that is left free by said mask; and
    applying a gate dielectric provided for transistors of an addressing circuitry onto said area that is left free by said mask.

7. The method according to claim 1, further comprising, after filling said trenches, forming a plurality of wordlines over the main surface.

8. A method for producing a charge-trapping memory cell array, the method comprising:
    providing a semiconductor body having a main surface;
    applying a lower confinement layer of a first dielectric material over said main surface;
    applying a charge-trapping layer over said lower confinement layer;
    after applying the charge-trapping layer, performing a lithography step and a subsequent etching step to form trenches running parallel at a distance from one another at said main surface, wherein the lithography step is performed directly without deposition of a sacrificial oxide layer over the charge-trapping layer;
    filling the trenches with a second dielectric material; and
    concurrently with or after filling the trenches, forming an upper confinement layer over said charge-trapping layer.

9. The method according to claim 8, wherein filling the trenches comprises depositing the second dielectric material in the trenches.

10. The method according to claim 9, wherein depositing the second dielectric material in the trenches also forms the upper confinement layer.

11. The method according to claim 8, wherein filling the trenches comprises growing the second dielectric material.

12. The method according to claim 11, wherein the steps of filling the trenches and forming the upper confinement layer are performed by the growing of the dielectric material.

13. The method according to claim 8, wherein applying a charge-trapping layer comprises applying a silicon nitride layer.

14. The method according to claim 8, further comprising:
    covering an area of said main surface that is provided for the memory cell array by a mask, after the forming the upper confinement layer;
    removing said upper confinement layer, said charge-trapping layer and said lower confinement layer in an area that is left free by said mask; and
    applying a gate dielectric provided for transistors of an addressing circuitry onto said area that is left free by said mask.

15. The method according to claim 8, wherein the semiconductor body comprises a silicon substrate.

16. A method for producing a charge-trapping memory cell array, the method comprising:
- providing a silicon substrate having a main surface;
- applying a lower confinement layer of a first dielectric material onto said main surface;
- applying a charge-trapping layer onto said lower confinement layer;
- after the applying the charge-trapping layer, performing a lithography step and a subsequent etching step to form trenches running parallel at a distance from one another at said main surface, wherein the lithography step is performed directly without deposition of a sacrificial oxide layer over the charge-trapping layer;
- filling said trenches by a selective oxidation of the silicon substrate;
- after filling said trenches, forming an upper confinement layer on top of said charge-trapping layer; and
- after forming the upper confinement layer, forming a wordline stack over the upper confinement layer.

17. The method according to claim 16, wherein applying a charge-trapping layer comprises applying a silicon nitride layer.

18. The method according to claim 16, further comprising:
- covering an area of said main surface that is provided for the memory cell array by a mask, after forming the upper confinement layer;
- removing said upper confinement layer, said charge-trapping layer and said lower confinement layer in an area that is left free by said mask; and
- applying a gate dielectric provided for transistors of an addressing circuitry onto said area that is left free by said mask.

19. The method according to claim 16, wherein forming the upper confinement layer comprises:
- growing a second dielectric material.

20. The method according to claim 16, wherein forming the upper confinement layer comprises:
- depositing a second dielectric material.

* * * * *